United States Patent
Kim et al.

(10) Patent No.: US 8,564,369 B2
(45) Date of Patent: Oct. 22, 2013

(54) LINEAR AMPLIFIER

(75) Inventors: Yu Sin Kim, Daejeon (KR); Youn Suk Kim, Gyunggi-do (KR); Gyu Hyeong Cho, Daejeon (KR); Chang Seok Chae, Daejeon (KR); Young Sub Yuk, Daejeon (KR)

(73) Assignees: Samsung Electro-Mechanics Co., Ltd., Suwon (KR); Korea Advanced Institute of Science and Technology, Daejeon (KR)

( * ) Notice: Subject to any disclaimer, the term of this patent is extended or adjusted under 35 U.S.C. 154(b) by 35 days.

(21) Appl. No.: 13/312,288

(22) Filed: Dec. 6, 2011

(65) Prior Publication Data

US 2012/0139637 A1 Jun. 7, 2012

(30) Foreign Application Priority Data

Dec. 7, 2010 (KR) .................. 10-2010-0124436

(51) Int. Cl.
*H03F 1/30* (2006.01)

(52) U.S. Cl.
USPC ........................................ 330/260; 330/293

(58) Field of Classification Search
USPC ....................... 330/260, 293, 150, 98, 310
See application file for complete search history.

(56) References Cited

U.S. PATENT DOCUMENTS

| | | | | |
|---|---|---|---|---|
| 4,728,901 | A | * | 3/1988 | Pepper ........................ 330/260 |
| 7,538,615 | B2 | * | 5/2009 | Su et al. ...................... 330/260 |
| 7,589,507 | B2 | * | 9/2009 | Mandal ........................ 323/273 |
| 7,847,846 | B1 | * | 12/2010 | Ignjatovic et al. ............ 348/301 |
| 2002/0171480 | A1 | | 11/2002 | Piessens et al. | |

FOREIGN PATENT DOCUMENTS

KR  10-2009-0013547 A  2/2009

OTHER PUBLICATIONS

Korean Office Action, w/ English translation thereof, issued in Korean Patent Application No. 10-2010-0124436, dated Dec. 8, 2011.

* cited by examiner

*Primary Examiner* — Henry Choe
(74) *Attorney, Agent, or Firm* — McDermott Will & Emery LLP

(57) ABSTRACT

There is provided a linear amplifier capable of suppressing a reduction in bandwidth and reducing a ripple voltage by using a source follower and a local feedback loop. The linear amplifier includes an amplifier amplifying an input signal according to a difference in signal level between the input signal and a feedback signal, and a buffer buffering a signal amplified in the amplifier by a source follow method, suppressing a reduction in bandwidth of the signal, outputting the signal, and providing the bufferred signal to the amplifier as the feedback signal.

8 Claims, 7 Drawing Sheets

LINEAR AMPLIFIER

CROSS-REFERENCE TO RELATED APPLICATIONS

This application claims the priority of Korean Patent Application No. 10-2010-0124436 filed on Dec. 7, 2010, in the Korean Intellectual Property Office, the disclosure of which is incorporated herein by reference.

BACKGROUND OF THE INVENTION

1. Field of the Invention

The present invention relates to a linear amplifier, and more particularly, to a linear amplifier capable of suppressing a reduction in bandwidth and reducing a ripple voltage by using a source follower and a local feedback loop.

2. Description of the Related Art

Recently, the demand for a technology capable of rapidly transmitting low-capacity data such as voice or characters and large-capacity data such as moving pictures has increased with the development of wireless communications technology.

A typical RF amplifier cannot rapidly transmit large-capacity data while maintaining appropriate power efficiency. As a result, a method for separating the phase component and envelope component of a signal and transmitting them to an RF amplifier has been devised. As the method, an envelope tracking (ET) method using a linear RF power amplifier and a polar method using a switching power amplifier have been mainly used.

In order to implement an envelope modulator adopting the polar method, a method using a linear amplifier, a method using a switching amplifier, or a hybrid method using the linear amplifier and the switching amplifier has been used.

Among the above-mentioned methods, the hybrid method capable of using the advantages of both the linear amplifier and the switching amplifier has been mainly used. However, as power to be supplied to the RF power amplifier from the envelope modulator is increased, the current driving capability of the linear amplifier should be increased accordingly. As a result, there are problems in that the bandwidth is reduced and the ripple voltage is increased

SUMMARY OF THE INVENTION

An aspect of the present invention provides a linear amplifier capable of suppressing a reduction in bandwidth and reducing a ripple voltage by using a source follower and a local feedback loop.

According to an aspect of the present invention, there is provided a linear amplifier, including: an amplifier amplifying an input signal according to a difference in signal level between the input signal and a feedback signal; and a buffer buffering a signal amplified in the amplifier by a source follow method, suppressing a reduction in bandwidth of the signal, outputting the signal, and providing the buffered signal to the amplifier as the feedback signal.

The buffer may include: a removing unit removing body effects of a transistor supplying a bias required for the source follow method; a controller controlling an output signal to be rail to rail swing amplified; a feedback providing unit providing preset first and second local feedback loops in a transfer path of a signal from the removing unit to suppress the reduction in bandwidth of the amplified signal; a bias unit supplying a bias required for the source follow method; a buffer unit buffering the amplified signal by the source follow method and suppressing the reduction in bandwidth of the amplified signal; and an output unit outputting the buffered signal from the buffer unit and providing the output signal to the amplifier as the feedback signal.

The output unit may include: a first output unit driving current of the buffered signal; and a second output unit driving voltage of the buffered signal.

The buffer unit may provide a preset local feedback loop in a transfer path of the buffered signal to suppress the reduction in bandwidth of the buffered signal.

The buffer may include: first and second current sources supplying a preset current; a first cascode current mirror connected between the first and second current sources and a ground; first and second PMOS type source followers connected to the first cascode current mirror to provide a preset third local feedback loop; third and fourth current sources sinking the preset current; a second cascode current mirror connected between a driving power supply terminal and the third and fourth current sources; and first and second NMOS type source followers connected to the second cascode current mirror to provide a preset fourth local feedback loop.

The bias unit may include: a first bias voltage providing unit providing a preset bias voltage to a gate of the first PMOS type source follower; a second bias voltage providing unit providing a preset bias voltage to a gate of the first NMOS type source follower; a first bias voltage reference unit providing a preset reference voltage to the first bias voltage providing unit; and a second bias voltage reference unit providing a preset reference voltage to the second bias voltage providing unit.

The feedback providing unit may include: a first local feedback loop providing unit providing the first local feedback loop to suppress the reduction in bandwidth of the amplified signal; and a second local feedback loop providing unit providing the second local feedback loop to suppress the reduction in bandwidth of the amplified signal.

The first local feedback loop providing unit may include: a third bias voltage providing unit providing a preset bias voltage; a pair of NMOS transistors providing a preset reference voltage to the third bias voltage providing unit; and a third PMOS type source follower receiving the bias voltage from the third bias voltage providing unit.

The second local feedback loop providing unit may include: a fourth bias voltage providing unit providing a preset bias voltage; a pair of PMOS transistors providing a preset reference voltage to the fourth bias voltage providing unit; and a third NMOS type source follower receiving the bias voltage from the fourth bias voltage providing unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
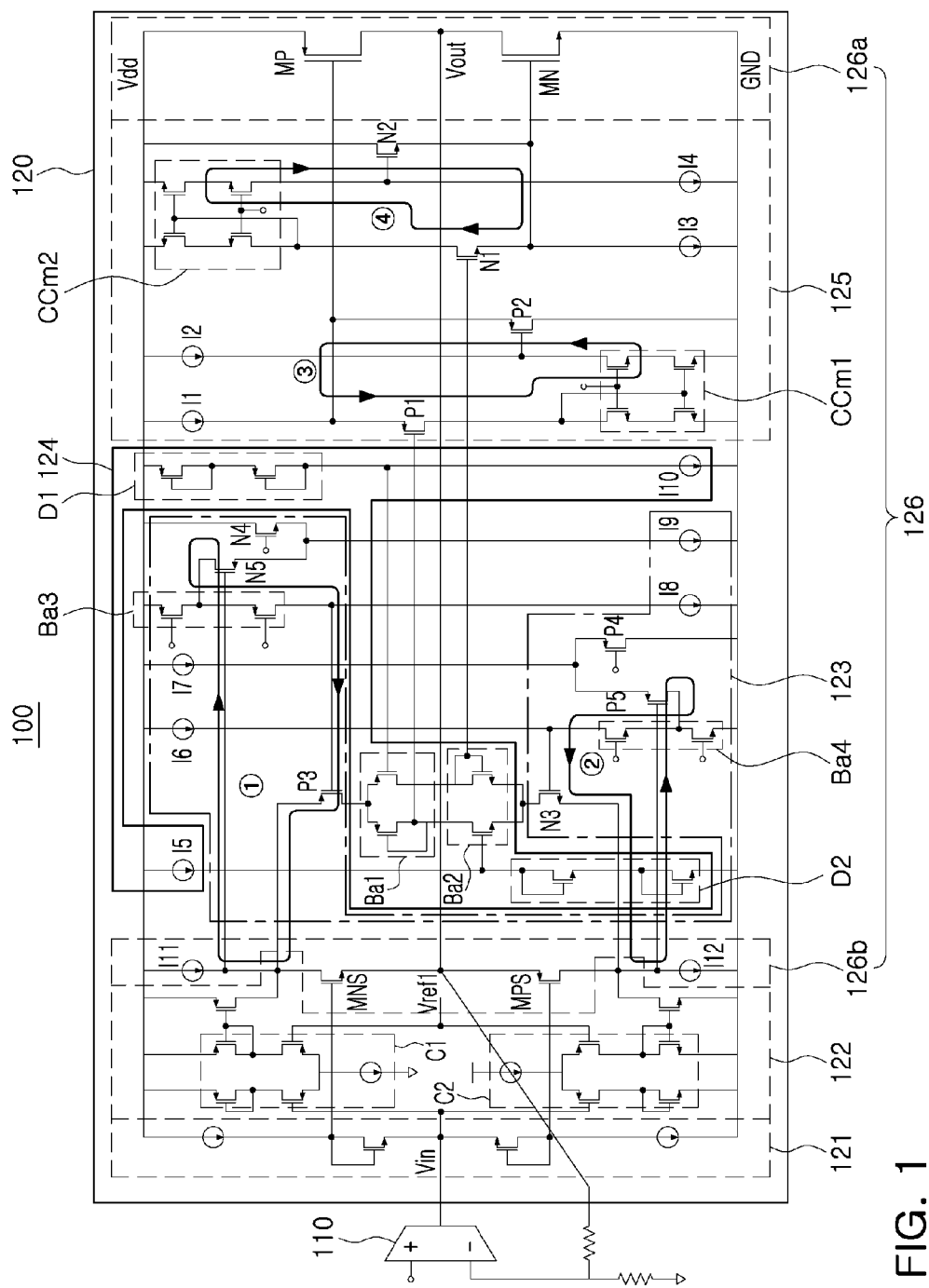
FIG. 1 is a diagram schematically showing the configuration of a linear amplifier according to an exemplary embodiment of the present invention.

FIG. 1 is a diagram schematically showing the configuration of a linear amplifier according to an exemplary embodiment of the present invention.

Referring to FIG. 1, a linear amplifier 100, according to an exemplary embodiment of the present invention, may be configured to include an amplifier 110 and a buffer 120.

The amplifier 110 may compare a voltage level of an input signal with that of a feedback signal and amplify the input signal according to the difference in voltage level therebetween. The amplifier 110 may be configured of an operational transconductance amplifer (OTA). Meanwhile, the amplified signal in the amplifier 110 maybe transferred to the buffer 120.

The buffer 120 may be configured to include a removing unit 121, a controller 122, a feedback providing unit 123, a bias unit 124, a buffer unit 123, and an output unit 126.

The removing unit 121 may remove body effects generated by a transistor included in the bias unit 125.

The controller 122 may control a rail-to-rail swing so that output signals are amplified to both rails. To this end, the controller 122 may include first and second comparators C1 and C2, each being configured of an MOSFET.

The feedback providing unit 123 may suppress a reduction in bandwidth of the amplified signal by providing first and second local feedback loops ① and ② in a transfer path of the amplified signal.

The bias unit 124 may supply the preset bias power.

The buffer unit 125 may buffer a signal by using a source follow method and suppress a reduction in bandwidth of the buffered signal by providing preset third and fourth local feedback loops ③ and ④ in a signal transfer path.

The output unit 126 may output the signal from the buffer unit 125 by driving the voltage and current thereof and may cause negative-feedback to the output and provide it to the amplifier 110 as the feedback signal.

More specifically, the output unit 124 may be configured to include a first output unit 126a and a second output unit 126b. The first output unit 126a may drive the current of the output signal and the second output unit 126b may drive the voltage of the output signal.

The first output unit 126a maybe configured to include a PMOS transistor MP and an NMOS transistor MN that are connected in series between a driving voltage terminal Vdd and a ground. The sizes of the PMOS transistor MP and the NMOS transistor MN are enlarged to drive the current of the output signal and the capacitance of the gate is increased accordingly, thereby reducing the bandwidth of the output signal.

Similarly, the second output unit 126b may be configured to include current sources I11 and I12 that supply and sink the preset current and a PMOS transistor MPS and an NMOS MNS that are connected in series between the current sources. The sizes of the PMOS transistor MPS and the NMOS transistor MNS are enlarged to drive the voltage of the output signal and the capacitance of the gate is increased accordingly, thereby reducing the bandwidth of the output signal.

Therefore, the buffer unit 125 and the feedback providing unit 123 buffer the signals by the source follow method, and provide negative local feedback loops to suppress the reduction in bandwidth of the output signal.

The buffer unit 125 maybe configured to include a first cascode current mirror CCm1 and a second cascode current mirror CCm2 connected between a driving power supply terminal Vdd and a ground, first and second current sources I1 and I2 connected between the driving power supply terminal Vdd and the first cascode current mirror CCm1, first and second PMOS type source followers P1 and P2 connected to the first cascode current mirror CCm1, first and second NMOS type source followers N1 and N2 connected to the second cascode current mirror CCm2, and third and fourth current sources I3 and I4 connected between a ground terminal GND and the second cascode current mirror CCm2.

The buffer unit 125 may buffer signals by the source follow method and may provide the third and fourth negative local feedback loops ③ and ④. The third negative local feedback loop ③ is configured by the first and second PMOS type source followers P1 and P2 and a portion of the first cascode current mirror CCm1, thereby suppressing the reduction in bandwidth of the signal due to the PMOS transistor MP of the first output unit 126a. The fourth negative local feedback loop ④ is configured by the first and second NMOS type source followers N1 and N2 and a portion of the second cascode current mirror CCm2, thereby suppressing the reduction in bandwidth of the signal due to the NMOS transistor MN of the first output unit 126a.

The bias unit 124 may be configured to include first and second bias voltage providing units Ba1 and Ba2 and first and second bias voltage reference units.

The first and second bias voltage providing units Ba1 and Ba2 may each be configured of a P type metal-oxide-semiconductor field-effect transistor (MOSFE) or an N-type MOSFET connected in parallel.

The first and second bias voltage reference units may each be configured to include first and second diodes D1 and D2 and fifth or sixth current sources I5 and I6 that are connected in series between the driving power supply terminal Vdd and the ground, and may provide a reference voltage having the preset voltage level to the respective first and second bias voltage providing units Ba1 and Ba2. The first and second diodes D1 and D2 may each be configured of an MOSFET.

The first and second bias voltage providing units Ba1 and Ba2 may provide a bias voltage having a preset voltage level to the first PMOS type and first NMOS type source followers P1 and N1, respectively.

The feedback providing unit 123 may be configured to include a first local feedback loop providing unit suppressing the reduction in bandwidth of the amplified signal by providing the first local feedback loop ① and a second local feedback loop providing unit suppressing the reduction in bandwidth of the amplified signal by providing the second local feedback loop ②.

The first local feedback loop providing unit may be configured to include a third bias voltage providing unit Ba3 providing a preset bias voltage, a pair of NMOS transistors N4 and N5 providing a preset reference voltage to the third bias voltage providing unit Ba3, and a third PMOS type source follower P3 receiving the bias voltage from the third bias voltage providing unit.

The second local feedback loop providing unit may be configured to include a fourth bias voltage providing unit Ba4 providing a preset bias voltage, a pair of PMOS transistors P4 and P5 providing a preset reference voltage to the fourth bias voltage providing unit Ba4, and a third NMOS type source follower N3 receiving the bias voltage from the fourth bias voltage providing unit.

Figure 2:
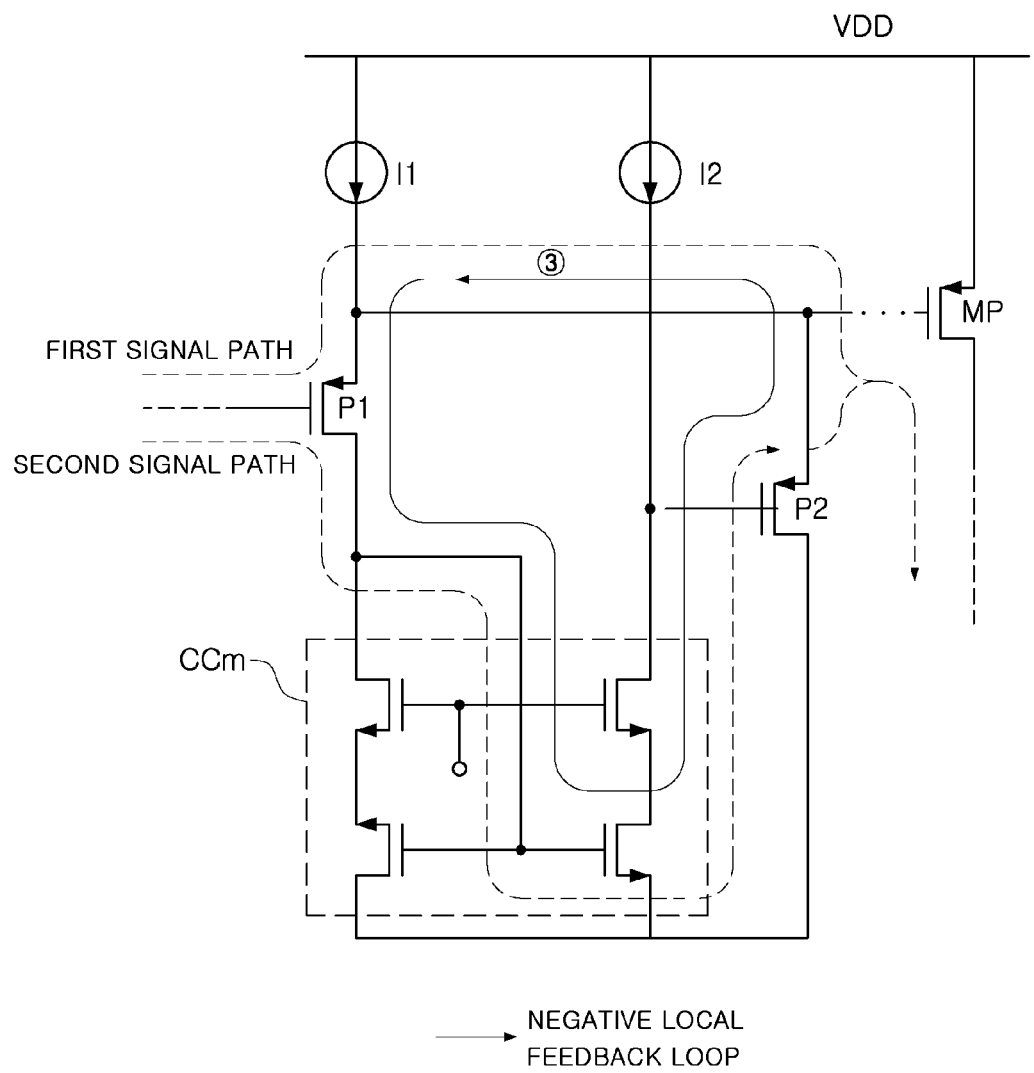
FIG. 2 is a diagram schematically showing the signal flow in a buffer unit according to an exemplary embodiment of the present invention.

FIG. 2 is a diagram schematically showing signal flow in a buffer unit according to an exemplary embodiment of the present invention.

Referring to FIGS. 1 and 2, the use of the third negative local feedback loop ③ makes it possible to rapidly implement current sourcing and sinking while sufficiently spacing a dominant pole from a second pole of the output signal.

The third negative local feedback loop ③ can rapidly implement the current sourcing of the PMOS transistor MP along a second signal path while reducing the impedance of the source node of the second PMOS type source follower P2.

Although FIG. 2 shows a portion of the buffer unit 125, the buffer unit 125 has a symmetrical structure, such that the fourth negative local feedback loop ④ may be formed at a symmetrical portion of the buffer unit (not shown). Therefore, a detailed description thereof will be omitted. However, the current sinking may be rapidly implemented in the symmetrical portion.

In order to suppress the reduction in bandwidth, a method of transferring a third pole of the output signal using a higher frequency may be used. To this end, a negative local feedback should be formed, including a node forming the third pole. In this configuration, a bias power of the third PMOS type source follower P3 may be supplied by using the negative feedback.

Figure 3:
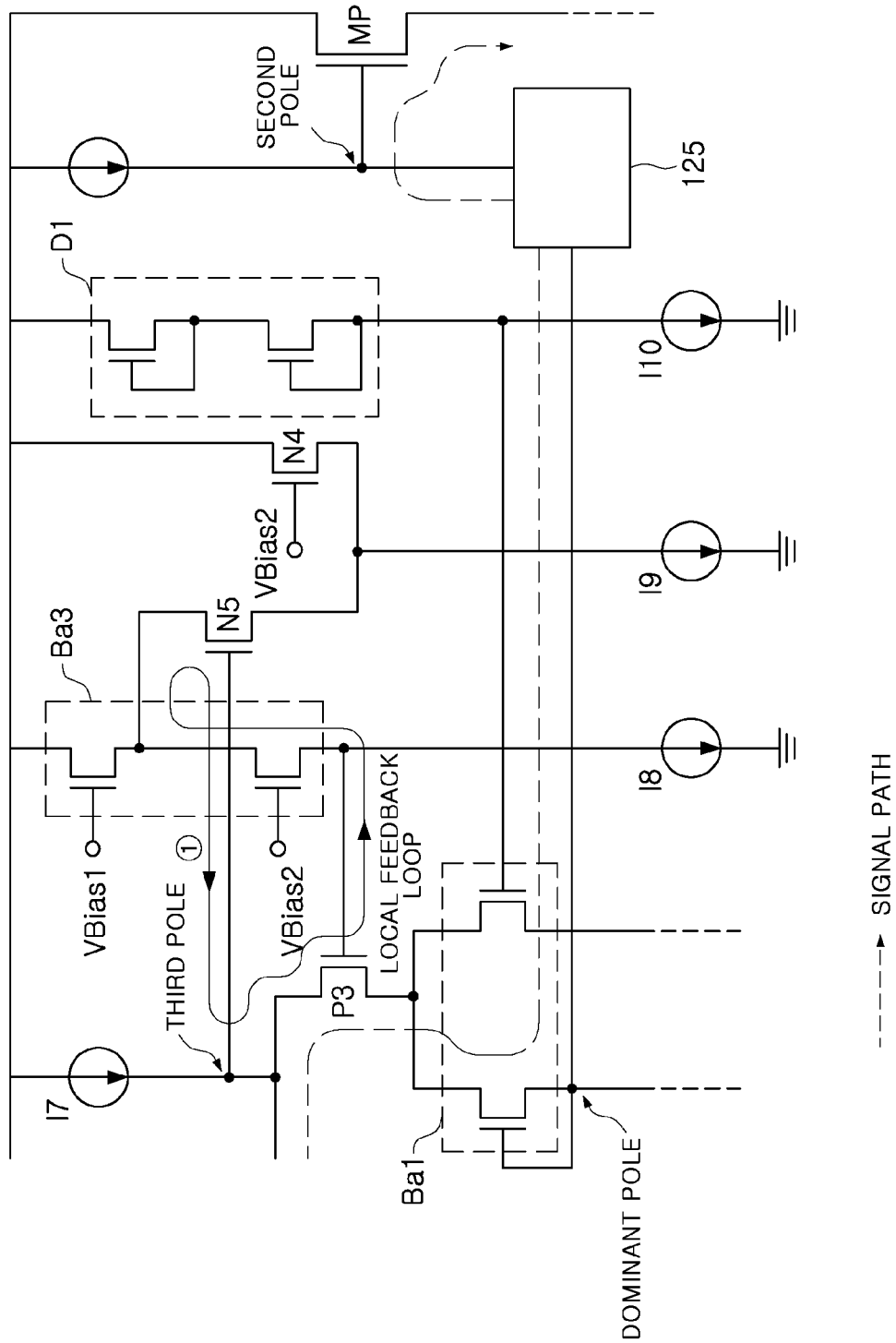
FIG. 3 is a diagram schematically showing the signal flow of a feedback providing unit and a bias unit according to an exemplary embodiment of the present invention.

FIG. 3 is a diagram schematically showing signal flow in a feedback providing unit and a bias unit adopted in the present invention.

Referring to FIGS. 1 and 3, the first negative local feedback loop ① is configured by the third PMOS type source follower P3, the third bias voltage providing unit Ba3, and the NMOS transistor N5, thereby transferring the third pole of the output signal using the high frequency band.

Although not shown in FIG. 3, similar to the above-mentioned first negative local feedback loop ①, the second negative local feedback loop ② is provided at a symmetrical portion of the feedback providing unit 123 and the bias unit 124. The second negative local feedback loop ② is configured by the third NMOS type source follower N3, the fourth bias voltage providing unit Ba4, and the PMOS transistor P5,thereby transferring the dominant pole of the output signal using a high frequency band.

Figure 4:
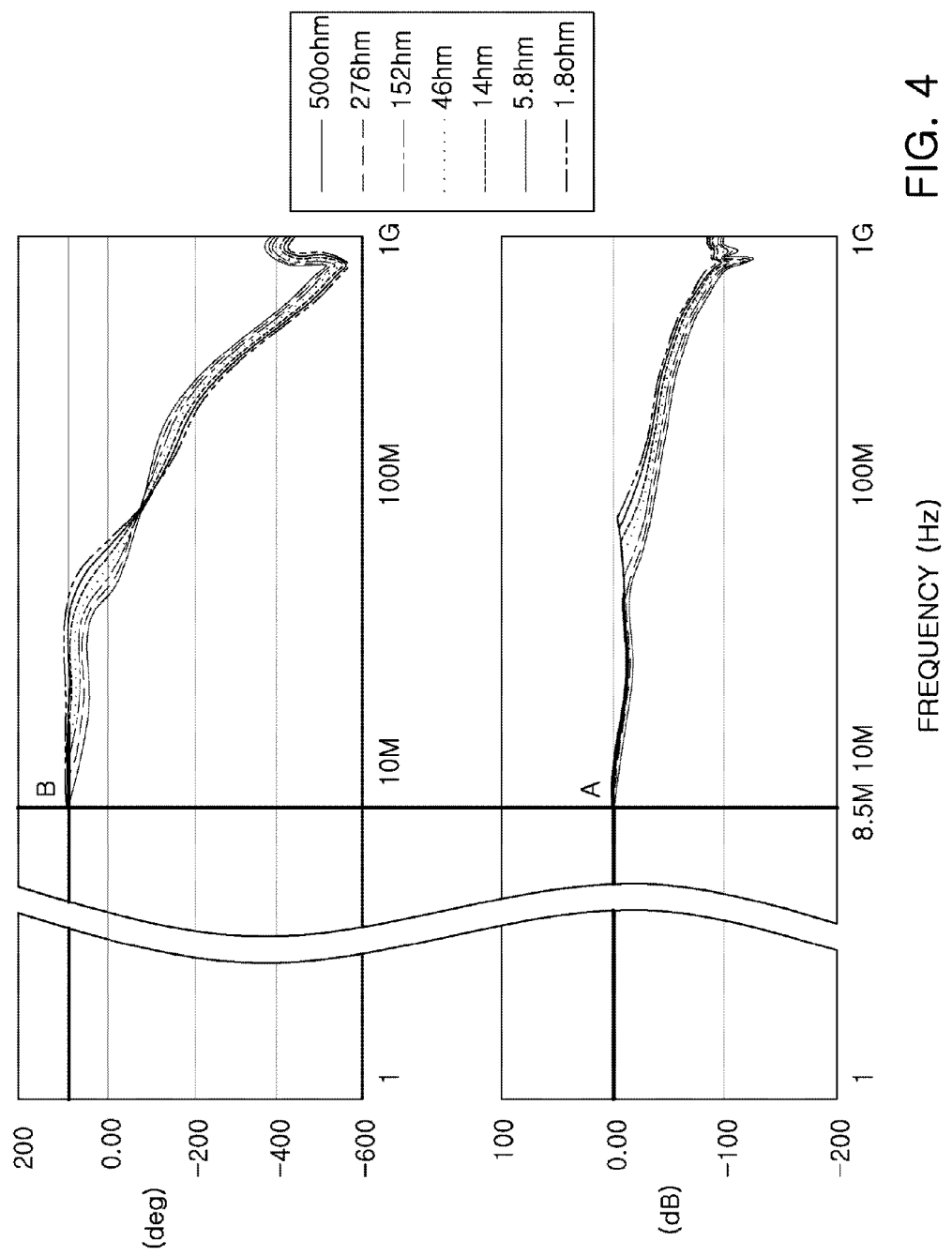
FIG. 4 is a graph showing the results of bandwidth measurement according to an exemplary embodiment of the present invention.

FIG. 4 is a graph showing the results of bandwidth measurement according to an exemplary embodiment of the present invention.

As shown in FIG. 4, the linear amplifier according to an exemplary embodiment of the present invention may stably drive a load at 1.8 ohm to 500 ohm using a driving power supply of 3. 8V. In this case, 1.8 ohm corresponds to impedance obtained by viewing the RF power amplifier from the amplification modulator when the RF power amplifier outputs a peak power, and 500 ohm corresponds to impedance obtained by viewing the RF power amplifier from the amplification modulator when the RF power amplifier outputs a lowest power.

Figure 5A:
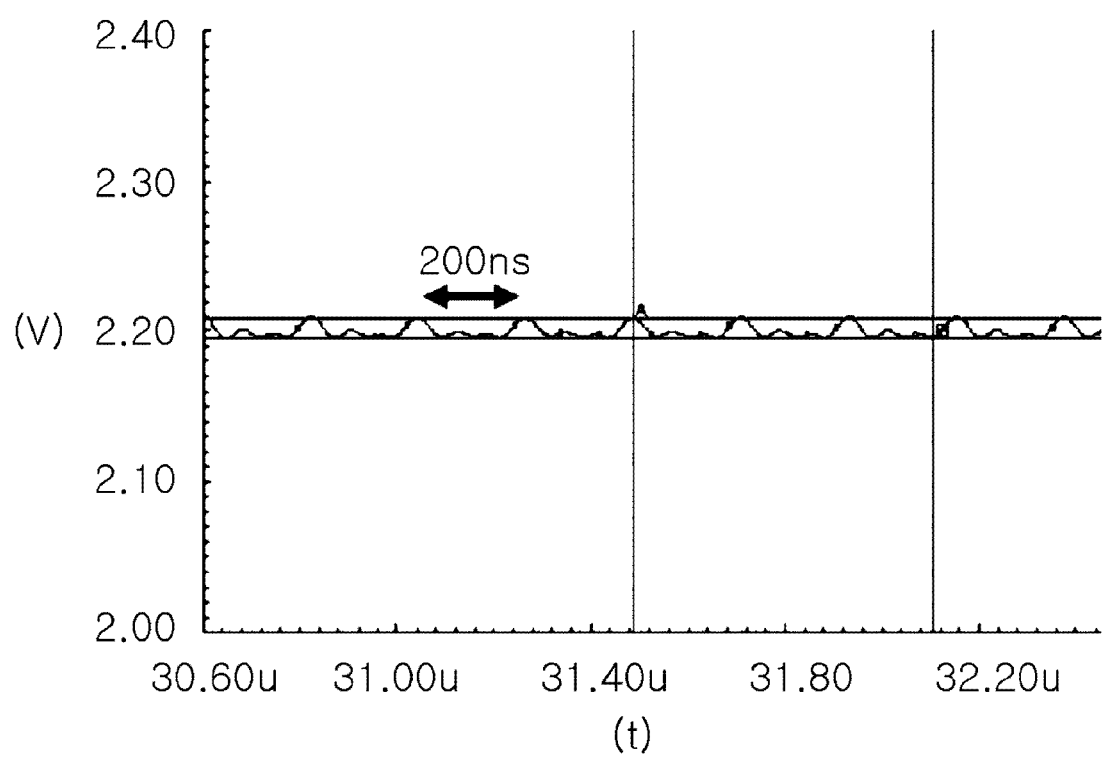
FIGS. 5A through 5C are graphs showing ripples according to output power according to an exemplary embodiment of the present invention.
Figure 5B:
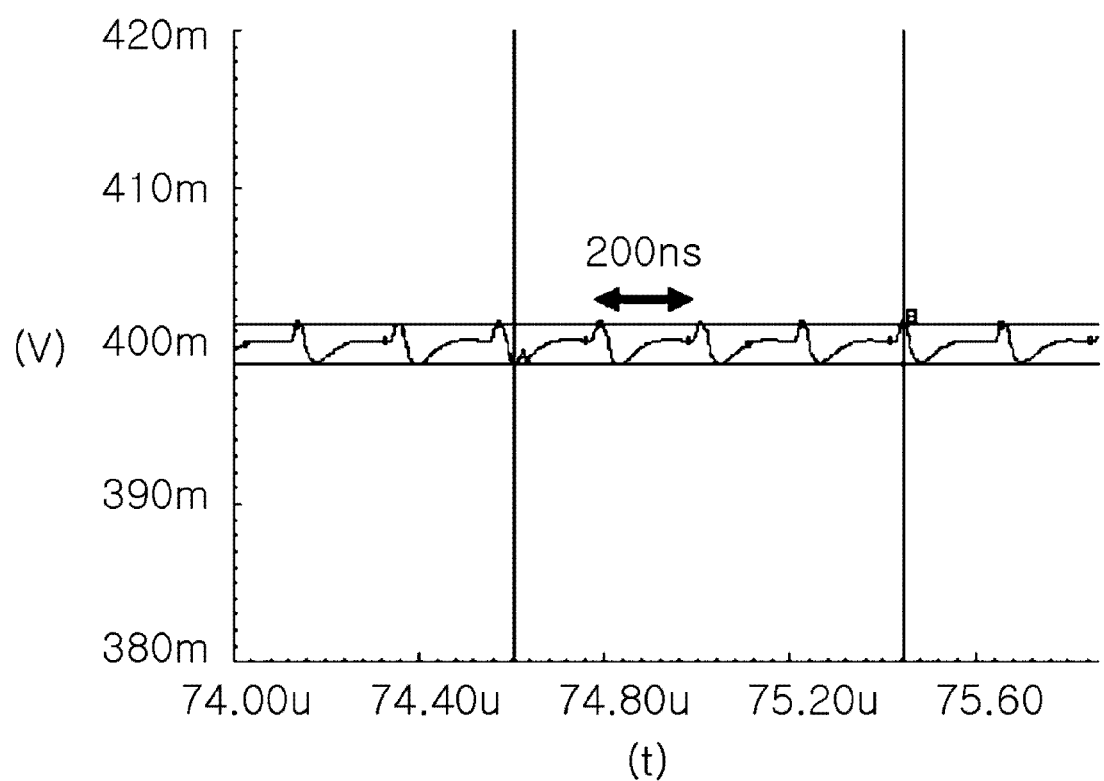
Figure 5C:
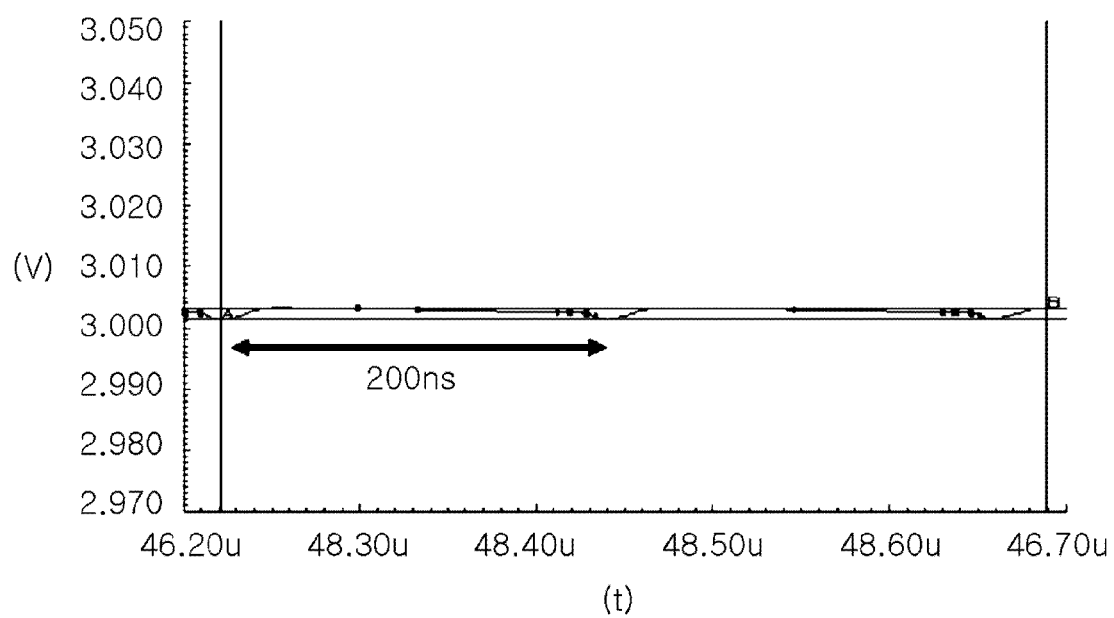

FIGS. 5A through 5C are graphs showing ripples according to output power, according to an exemplary embodiment of the present invention.

FIG. 5A shows a ripple voltage when the output power is half of the peak power, FIG. 5B shows a ripple voltage when the output power is a lowest output, and FIG. 5C shows a ripple voltage when the output power is a peak power. As shown, it can be appreciated that the linear amplifier is stably operated to have the ripple voltage of about 2 mV at the peak power, the ripple voltage of about 2.5 mV at the lowest power, and the ripple voltage of about 13 mV at the half power.

As described above, according to the exemplary embodiment of the present invention, the second pole, third pole, and dominant pole of the output signal are distanced apart from the usable frequency band by adopting the source follower and the negative local feedback loop in the linear amplifier, thereby suppressing the reduction in bandwidth of the usable frequency and reducing the ripple voltage.

As set forth above, according to the exemplary embodiment of the present invention,the linear amplifier including the source follower and the local feedback loop is used to thereby suppressing the increase in bandwidth and reducing the ripple voltage.

While the present invention has been shown and described in connection with the exemplary embodiments, it will be apparent to those skilled in the art that modification and variation can be made without departing from the spirit and scope of the invention as defined by the appended claims.

What is claimed is:

1. A linear amplifier, comprising:
   an amplifier amplifying an input signal according to a difference in signal level between the input signal and a feedback signal; and
   a buffer buffering a signal amplified in the amplifier by a source follow method, suppressing a reduction in bandwidth of the signal, outputting the signal, and providing the bufferred signal to the amplifier as the feedback signal,
   wherein the buffer includes:
      a removing unit removing body effects of a transistor supplying a bias required for the source follow method;
      a controller controlling an output signal to be rail to rail swing amplified;
      a feedback providing unit providing preset first and second local feedback loops in a transfer path of a signal from the removing unit to suppress the reduction in bandwidth of the amplified signal;
      a bias unit supplying a bias required for the source follow method;
      a buffer unit buffering the amplified signal by the source follow method and suppressing the reduction in bandwidth of the amplified signal; and
      an output unit outputting the buffered signal from the buffer unit and providing the output signal to the amplifier as the feedback signal.

2. The linear amplifier of claim 1, wherein the output unit includes:
   a first output unit driving current of the buffered signal; and
   a second output unit driving voltage of the buffered signal.

3. The linear amplifier of claim 1, wherein the buffer unit provides a preset local feedback loop in a transfer path of the buffered signal to suppress the reduction in bandwidth of the buffered signal.

4. The linear amplifier of claim 3, wherein the buffer includes:
   first and second current sources supplying a preset current;
   a first cascode current mirror connected between the first and second current sources and a ground;
   first and second PMOS type source followers connected to the first cascode current mirror to provide a preset third local feedback loop;
   third and fourth current sources sinking the preset current;
   a second cascode current mirror connected between a driving power supply terminal and the third and fourth current sources; and first and second NMOS type source followers connected to the second cascode current mirror to provide a preset fourth local feedback loop.

5. The linear amplifier of claim 4, wherein the bias unit includes:
- a first bias voltage providing unit providing a preset bias voltage to a gate of the first PMOS type source follower;
- a second bias voltage providing unit providing a preset bias voltage to a gate of the first NMOS type source follower;
- a first bias voltage reference unit providing a preset reference voltage to the first bias voltage providing unit; and
- a second bias voltage reference unit providing a preset reference voltage to the second bias voltage providing unit.

6. The linear amplifier of claim 1, wherein the feedback providing unit includes:
- a first local feedback loop providing unit providing the first local feedback loop to suppress the reduction in bandwidth of the amplified signal; and
- a second local feedback loop providing unit providing the second local feedback loop to suppress the reduction in bandwidth of the amplified signal.

7. The linear amplifier of claim 6, wherein the first local feedback loop providing unit includes:
- a third bias voltage providing unit providing a preset bias voltage;
- a pair of NMOS transistors providing a preset reference voltage to the third bias voltage providing unit; and
- a third PMOS type source follower receiving the bias voltage from the third bias voltage providing unit.

8. The linear amplifier of claim 6, wherein the second local feedback loop providing unit includes:
- a fourth bias voltage providing unit providing a preset bias voltage;
- a pair of PMOS transistors providing a preset reference voltage to the fourth bias voltage providing unit; and
- a third NMOS type source follower receiving the bias voltage from the fourth bias voltage providing unit.

\* \* \* \* \*